United States Patent
Bhardwaj et al.

(10) Patent No.: US 7,306,745 B1
(45) Date of Patent: Dec. 11, 2007

(54) METHOD AND APPARATUS FOR STABILIZING A PLASMA

(75) Inventors: Jyoti Kiron Bhardwaj, Bristol (GB); Leslie Michael Lea, Oxfordshire (GB); Edward Guibarra, Cardiff (GB)

(73) Assignee: Surface Technology Systems PLC, Newport, Gwent (GB)

( * ) Notice: Subject to any disclaimer, the term of this patent is extended or adjusted under 35 U.S.C. 154(b) by 0 days.

(21) Appl. No.: 09/674,925

(22) PCT Filed: Apr. 12, 2000

(86) PCT No.: PCT/GB00/01383

§ 371 (c)(1),
(2), (4) Date: Nov. 8, 2000

(87) PCT Pub. No.: WO00/62328

PCT Pub. Date: Oct. 19, 2000

(30) Foreign Application Priority Data

Apr. 14, 1999 (GB) ................................ 9908374.3
Jun. 24, 1999 (GB) ................................ 9914689.6

(51) Int. Cl.
*B44C 1/22* (2006.01)

(52) U.S. Cl. .................... 216/37; 216/67; 216/59; 438/14; 438/710; 438/714

(58) Field of Classification Search ................ 216/37, 216/67, 59; 438/14, 710, 714, 4; 118/723 J, 118/723 E
See application file for complete search history.

(56) References Cited

U.S. PATENT DOCUMENTS

| | | | |
|---|---|---|---|
| 3,569,777 A * | 3/1971 | Beaudry ................. 315/111.21 |
| 4,795,529 A * | 1/1989 | Kawasaki et al. ......... 118/50.1 |
| 4,985,114 A * | 1/1991 | Okudaira et al. ........ 204/192.3 |
| 5,414,324 A * | 5/1995 | Roth et al. ................ 118/723 E |
| 5,424,691 A * | 6/1995 | Sadinsky .................... 333/17.3 |
| 5,492,735 A * | 2/1996 | Saito ...................... 427/255.28 |
| 5,501,893 A | 3/1996 | Laermer et al. ............ 428/161 |
| 5,513,765 A | 5/1996 | Usui ........................... 216/68 |
| 5,688,357 A * | 11/1997 | Hanawa .................. 156/345.28 |
| 5,882,488 A * | 3/1999 | Leiphart ................... 204/192.3 |
| 6,187,685 B1 * | 2/2001 | Hopkins et al. ............. 156/345 |

(Continued)

FOREIGN PATENT DOCUMENTS

EP 0 363 982 10/1988

(Continued)

*Primary Examiner*—Shamim Ahmed
(74) *Attorney, Agent, or Firm*—Volentine & Whitt, PLLC

(57) ABSTRACT

A workpiece is processed in a chamber by striking a plasma in the chamber, treating the workpiece by cyclically adjusting the processing parameters between at least a first step having a first set of processing parameters and a second step having a second set of process parameters, wherein the plasma is stabilized during the transition between the first and second steps. These steps may comprise cyclic etch and deposition steps. One possibility for stabilizing the plasma is by matching the impedance of the plasma to the impedance of the power supply which provides energy to the plasma, by means of a matching unit which can be controlled in a variety of ways depending upon the step type or time during the step. Another possibility is to prevent or reduce substantially variation in the pressure in the chamber between the first and second steps.

35 Claims, 7 Drawing Sheets

U.S. PATENT DOCUMENTS 6,194,038 B1  2/2001  Rossman

FOREIGN PATENT DOCUMENTS

| | | |
|---|---|---|
| EP | 0 822 584 | 2/1998 |
| JP | 03-224226 A  * | 10/1991 |
| WO | WO 97/24748 | 7/1997 |
| WO | WO 98/47168 | 10/1998 |
| WO | WO 99/04425 | 1/1999 |
| WO | WO 99/47728 | 9/1999 |

* cited by examiner

METHOD AND APPARATUS FOR STABILIZING A PLASMA

BACKGROUND OF THE INVENTION

This invention relates to a method and apparatus for processing a workpiece in which a plasma struck in the chamber is stabilized during the transition between steps, particularly, although not exclusively, steps in a cyclic process in the treatment of the workpiece.

The plasma processing of a wafer or other workpiece may require certain plasma parameters to change between two or more states cyclically. The request for sudden changes in, for example, the gas pressure or discharge power between the states may lead to plasma instability or even lead to the plasma extinguishing.

A particular method to achieve highly anisotropic etches for high aspect ratio trenches is to use a switched process in which an etch step is alternated with a deposition step. Such a method is disclosed in WO-A-94/14187, EP-A-0822582 and EP-A-0822584. In the case of deep trench silicon etching, a passivating layer may be deposited on all surfaces of the wafer (including the trench), during the deposition step. During the initial part of the etch step, the passivating layer is required to be removed preferentially from the bottom of the trench by ion bombardment. This then allows the silicon to be removed by an essentially chemical process, from the bottom of the trench, during the remainder of the etch step. Alternating deposition and etch steps allows a high aspect ratio trench to be etched, contrasting with the use of the etch step alone which would result in a predominantly isotropic etch. One process gas or gas combination is switched off, or reduced in magnitude, and a second is switched on, or increased in magnitude, in changing from the etch step to the deposition step or vice versa during this cyclic process. During the change from one step to another step, plasma instability or extinguishing of the plasma may result.

SUMMARY OF THE INVENTION

This invention discloses ways of improving the plasma stability during each of the transitions.

According to a first aspect of the present invention, there is provided a method of processing a workpiece in a chamber, the method comprising:
(a) striking a plasma in the chamber;
(b) treating the workpiece by cyclically adjusting the processing parameters between at least a first step having a first set of processing parameters and a second step having a second set of process parameters; and
(c) stabilizing the plasma during the transition between the first and second steps.

Any suitable workpiece may be used, for example a wafer which typically may be formed of silicon.

Of course, more than two steps may be used in the treatment of the workpiece. When a cyclic process is used, the plasma is preferably stabilized between each cyclic step. The method is particularly applicable where a workpiece is treated by cyclically carrying out alternating etch and deposition steps.

The method further comprises supplying power to the plasma. For example, RF power may be inductively coupled into the plasma.

In one embodiment, the plasma may be stabilized by matching the impedance of the plasma to the impedance of the power supply which provides energy to the plasma by means of a matching unit. The given method of impedance matching is well known to those skilled in the art.

The matching unit may comprise, for an inductive load, two or more variable capacitors, possibly with additional fixed capacitors. Alternatively, variable inductors may be used with appropriate fixed capacitance.

The matching unit may be adjustable manually or electrically, although any suitable method of adjustment may be used. Preferably, when the plasma strikes, the plasma impedance is matched to the power supply impedance automatically for at least a part of the time of treatment of the workpiece. The matching unit may be pre-set to act in time at or just before the transition between the first and second steps, or indeed between all steps where more than two treatment steps are used. For example, in a switched etch/deposition process, the matching unit may be pre-set at or just before the transition between an etch step and a deposition step, or a deposition step and an etch step, in the cyclic process. In such an embodiment, the auto-matching may be re-enabled when the chamber pressure and/or other parameters have stabilized. In one embodiment, the automatic matching is disabled at or slightly before the transition. The pre-setting may be determined from a previous step of the same type in a cyclic process.

The matching unit may be driven by a motor. In one embodiment control signals are used to drive the motor and may be modified to track impedance changes rapidly, in order to minimise or eliminate "overshoot" as described in detail below.

In one embodiment, the matching unit comprises capacitors having set initial values for succeeding steps of the same type which are ramped or otherwise adjusted during the overall process. In a particular case the initial values for a step of one type may be obtained from the values found from automatic matching at the end of the previous step of the same type.

The capacitors in the matching unit may be adjusted to different values for each of the steps, but in conjunction to this or alternatively, the frequency of the power supply may be altered, either by a direct command or by an automatic control circuit. Frequency adjustment of the power supply to achieve matching of power into a plasma can be utilised to reduce or eliminate the need to adjust matching unit capacitor values. Generally frequency control is achieved on a short time scale and therefore automatic adjustments can occur at a much faster rate than it is possible to adjust capacitor values mechanically. However, pre-setting of the frequency for each of the steps may be a desirable feature under some circumstances.

For an industry standard 13.56 MHz power supply, the frequency variability required would be typically <+/−0.5 MHz, but with +/−1.0 MHz in extreme cases. Here one embodiment would include fixed matching unit capacitor positions, which did not vary between etch and deposition steps, and either a pre-set or automatically adjusted frequency of the RF from the power supply. Another embodiment would be to fix the matching unit capacitor positions to different appropriate settings for etch and deposition steps, and then either a pre-set or automatically adjust the frequency of the RF from the power supply.

As an alternative to, or in addition to, the matching unit described above, the plasma may be stabilized by substantially preventing or reducing variation of the pressure in the chamber between the first and second steps. When this is used in relation to a cyclic etch/deposition process, the deposition gas may be supplied, or increased in flow rate, before the etch gas is switched off, or reduced in flow rate, and the etch gas may be supplied, or increased in flow rate, before the deposition gas is switched off, or reduced in flow rate, during the cyclic process.

Thus, when a transition occurs from an etch to a deposition step, or from a deposition step to an etch step, the two types of gases may be allowed to enter the process chamber simultaneously during the transition. Furthermore, either of the etch or deposition gases may be allowed to flow throughout the switched process or for a significant proportion of it. Thus, the deposition gas may continue to flow throughout the etch step in addition to the deposition step, but in most circumstances at a much reduced rate, while the etch gas is only permitted to flow during the etch step. Alternatively the etch gas could continue to flow throughout the deposition step in addition to the etch step, but normally at a much reduced rate, while the deposition gas is only permitted to flow during the deposition step.

Another possibility is that both etch and deposition gases could be allowed to flow simultaneously and continuously as may be required to achieve a particular process result. However, the respective flow rates of the gases would generally vary for each of the steps. The flow rate of the etch gas will usually be much greater than the flow rate of the deposition gas during the etch step, and the flow rate of the deposition gas greater than the etch gas during the deposition step, so as still to maintain discrete etch and deposition steps.

The addition of deposition gas into the etch step and/or the addition of etch gas into the deposition step, enhances profile and sidewall roughness control. The mixing of the gases will generally reduce the plasma impedance transient. If sufficient deposition gas cannot be added into the etch step (and vice versa) to reduce the transient, then a higher flow rate of gas can be introduced during the transient period only.

The plasma may be stabilized by feeding a further gas into the chamber. This "buffer" gas reduces the variation in the pressure from the first to the second step, for example. Thus, in a cyclic etch/deposition process, the buffer gas reduces the variation in the pressure between each etch and deposition step or vice versa. The gas may be fed into the chamber by means of a fast acting flow controller. The "buffer" gas may be any suitable gas, although is typically a noble gas (for example helium or argon), oxygen or nitrogen or a mixture thereof. A preferred "buffer" gas is helium.

The method may further comprise monitoring the pressure in the chamber and adjusting the flow of gas accordingly. In one embodiment, there is at least some flow of the gas during the whole process. In one embodiment, the gas may be supplied throughout at least one step in the treatment of the workpiece.

The total pressure in the chamber may be ramped during a particular step.

In addition, or alternatively, a further means of reducing pressure variation in the chamber may be provided. Thus, the chamber may be provided with a portion (which in one embodiment may be in the form of a side chamber) separated from the main part of the process chamber by a deflectable member, for example a flexible membrane. The separated portion is preferably of a volume which is large compared to the main part of the process chamber. The membrane can then flex to adjust for pressure changes, to some extent, within the main part of the process chamber.

According to a second aspect of the present invention, there is provided a plasma processing apparatus comprising a chamber having a support for a workpiece, means for striking a plasma in the chamber, means for cyclically adjusting processing parameters between a first step and a second step, and means for stabilizing the plasma during the transition between the first and second steps.

The stabilizing means may comprise a matching unit for matching the impedance of the plasma to the impedance of a power supply which supplies power to the plasma. Alternatively, or additionally, the stabilizing means may comprise a means to vary the RF power supply frequency or may comprise means for reducing the variation of the pressure in the chamber between the first and second steps, for example means for feeding a gas into the chamber. This gas is the "buffer" gas described above.

Although the invention has been defined above, it is to be understood that it includes any inventive combination of the features set out above or in the following description.

BRIEF DESCRIPTION OF THE DRAWINGS

The invention may be performed in various ways and specific embodiments will now be described, by way of example, with reference to the accompanying drawings, and in which.

DETAILED DESCRIPTION OF THE PREFERRED EMBODIMENTS

Figure 1:
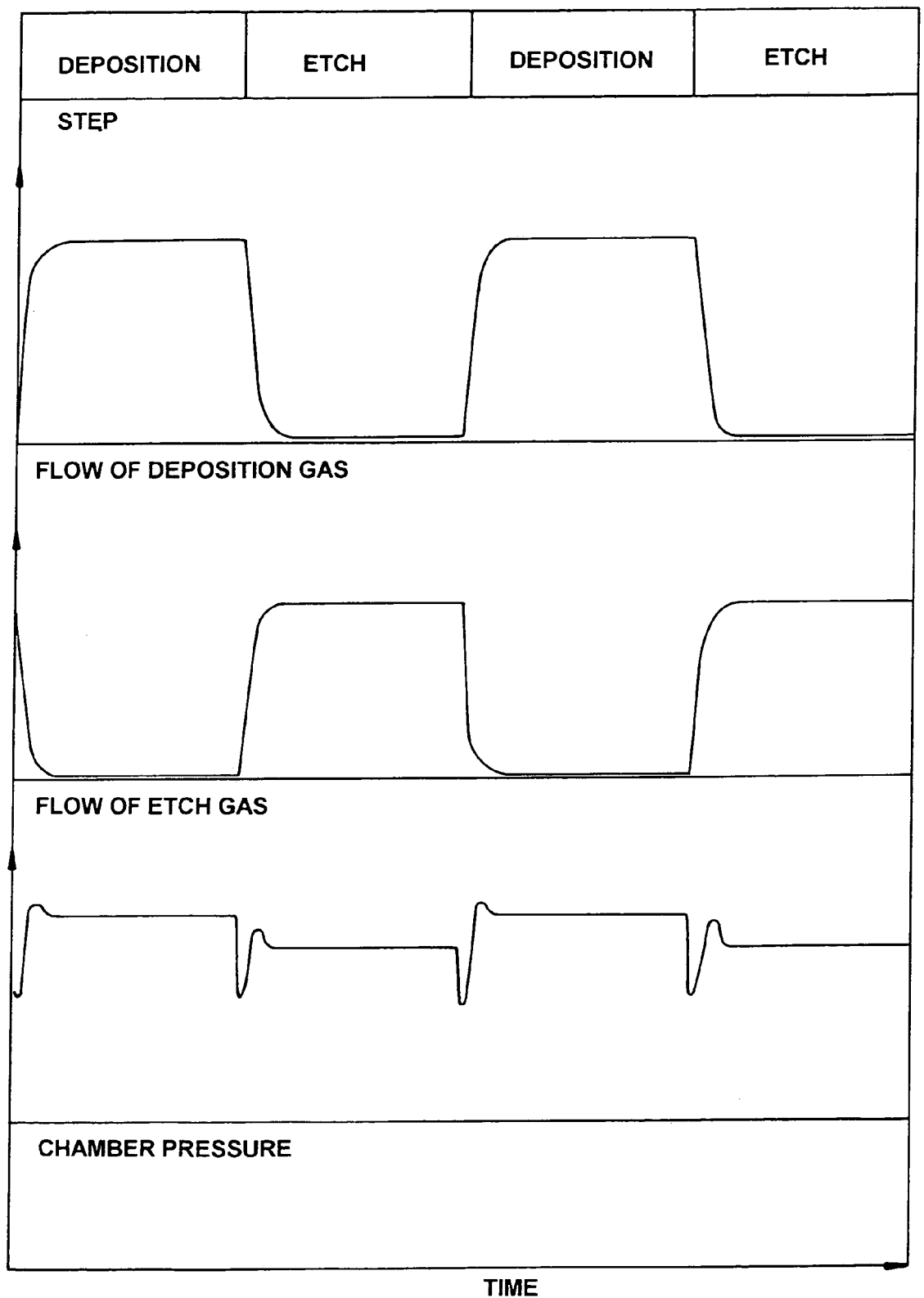
FIG. 1 shows graphically how etch and deposition gas flows and chamber pressure may vary during a switched process.

Referring to FIG. 1, the flow of deposition gas and etch gas and the chamber pressure is shown during a typical etch/deposition cyclic process. In changing from the etch step to the deposition step or vice versa, the process gas is switched. That is the mass flow controller, or alternative means (such as an actuating device which diverts the gas flow around the process chamber), controlling the first gas, is switched off, and the mass flow controller controlling the second gas is switched on. The switching on or off of each process gas may be on a reasonably short time scale, or one or other action may be more gradual, over a longer time scale. There may or may not be a period during which both types of process gas are being fed to the process chamber simultaneously, as the flow of one is being reduced and the flow of the other is being increased. The required flow levels of the two gases may be quite different and also the pressures required in the process chamber during each of the steps may be significantly different.

For a plasma processing apparatus in which radio frequency power is inductively coupled into the plasma, a matching unit of some form may be used to match the impedance of the RF power supply to the impedance of the plasma. For the different gases and different chamber filling pressures for each of the steps described above, the plasma impedance is likely to differ. This leads to a requirement for the matching unit settings to change during the switching from one step to the next. Usually this pressure transition is abrupt rather than gradual, with time constants less than the ability of the matching network to respond without an interim impedance "mismatch" resulting in reflection of a proportion of the power supplied.

In addition to the changes in process gas and chamber pressure between different steps, it is quite likely that the plasma and radical densities (and therefore the discharge power) required for each step will be different. This is another factor that can further enhance the difference in the plasma impedance between the different steps of a multi-step process.

To achieve a maximum overall etch rate from a multi-step process, it is desirable that the power supply impedance is matched to the plasma impedance throughout each step. It can be extremely detrimental to the processing if, after the switch from one step to the next, the plasma is unstable and not properly matched for a significant proportion of the respective step. In the extreme case of the plasma extinguishing during the transition from one step to the next, etch or deposition process time will be lost until the plasma is re-ignited, leading respectively either to a reduced etch depth or to a thinner deposited layer than required, either of which could produce severe distortion to a trench profile which requires a finely balanced, switched process.

Two particular embodiments of the invention are as follows:
1) To control the matching unit during the transition from one step to the next and preferably immediately afterwards, in order to minimise the time when the plasma impedance is not properly matched to the power supply impedance.
2) To control the supply of a buffer gas to the chamber so that it reduces the overall variation in process chamber pressure and hence plasma impedance.

These may be used separately or both parts may be used together.

1) Matching Unit Control

As stated previously, the function of the matching unit is to match the plasma impedance to the power supply impedance. The power supply impedance will usually be fixed at a value of 50 ohms. The matching unit used for an inductive load will normally contain two or more variable capacitors with possibly additional fixed capacitors. Alternatives may use variable inductors with appropriate fixed capacitance.

In its simplest form the matching unit may be manually adjustable to obtain the best match between plasma and power supply impedances. However, this technique may be difficult to use, if the impedance of the plasma load changes significantly between striking the plasma and steady operation i.e. the impedance of the antenna alone is seen before the plasma is struck, whereupon the impedance becomes that of antenna and plasma combined. For a switched process it would normally be impracticable to control manually the impedance matching elements at the required rate.

Figure 5:
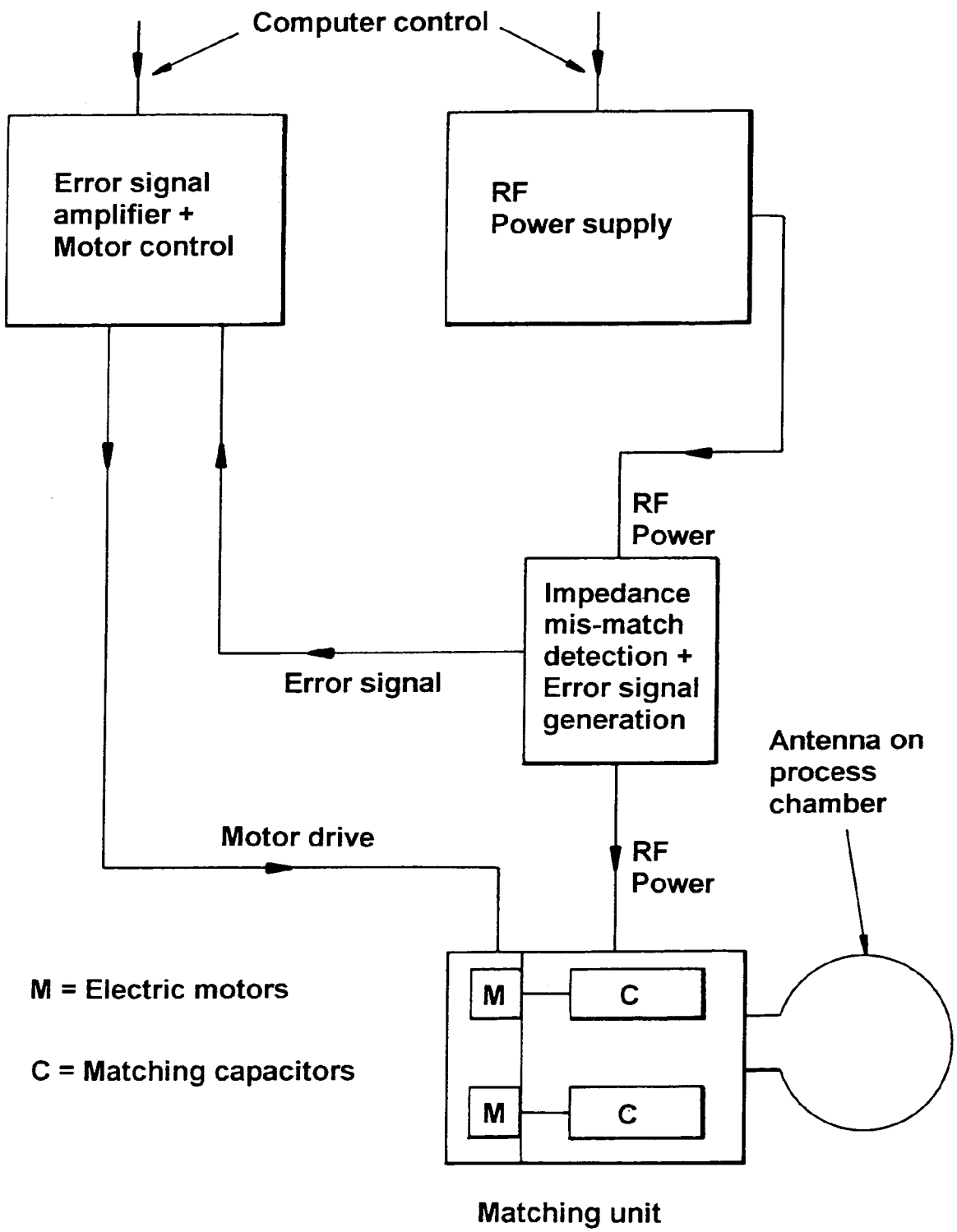
FIG. 5 shows a block schematic diagram of a matching unit control circuit.

An alternative matching unit utilising variable capacitors will usually use small electric motors, each driving one or more capacitors, and one embodiment is shown in FIG. 5. A dc or ac motor may be used, with a servo potentiometer to feedback capacitor setting, or alternatively a stepper motor/indexer arrangement may be used. Appropriate control circuitry allows the setting of each capacitor to be adjusted to a selected point before the plasma is struck.

When the plasma strikes, error signals relating to the real and imaginary parts of the plasma impedance can be detected, amplified and used to control the settings of the capacitors to achieve a stable match of the plasma impedance to the power supply impedance. This auto-matching ensures that, for a simple etch or deposition process, power is efficiently coupled into the plasma throughout the length of the process, even when conditions vary over a significant range during the process.

In a switched process, the switching may occur at intervals of several seconds, but greater or lesser periods may be used. The auto-matching should be capable of tracking the changes in plasma impedance during each step but, during the switch from one step to the next, the impedance change may be very rapid over a period of around one second or even less. The rapid impedance change may be due to, for example, a sudden pressure drop as one process gas is turned off and before the second gas has had time to reach its stable level. Furthermore, gas fragmentation by the plasma leads to a pressure increase and this effect becomes more pronounced as the power fed into the plasma is increased. Differences in the degree of gas fragmentation by the plasma as the gas changes, in a switched process can cause changes in the pressure, even for constant RF power feed. The auto-matching may try to track the impedance change due to the reducing pressure, only to find it reversing almost immediately. The inability to follow the changes quickly enough may result in an impedance mis-match which may not be corrected, until a significant fraction of the time allocated to the second step has elapsed. This is clearly not a desirable situation.

Thus, in one embodiment, the invention discloses the pre-setting of the matching unit settings at, or just before, the switch from one step to the next, and then re-enabling the auto-match system when chamber pressure and/or other appropriate parameters have stabilized.

Figure 2:
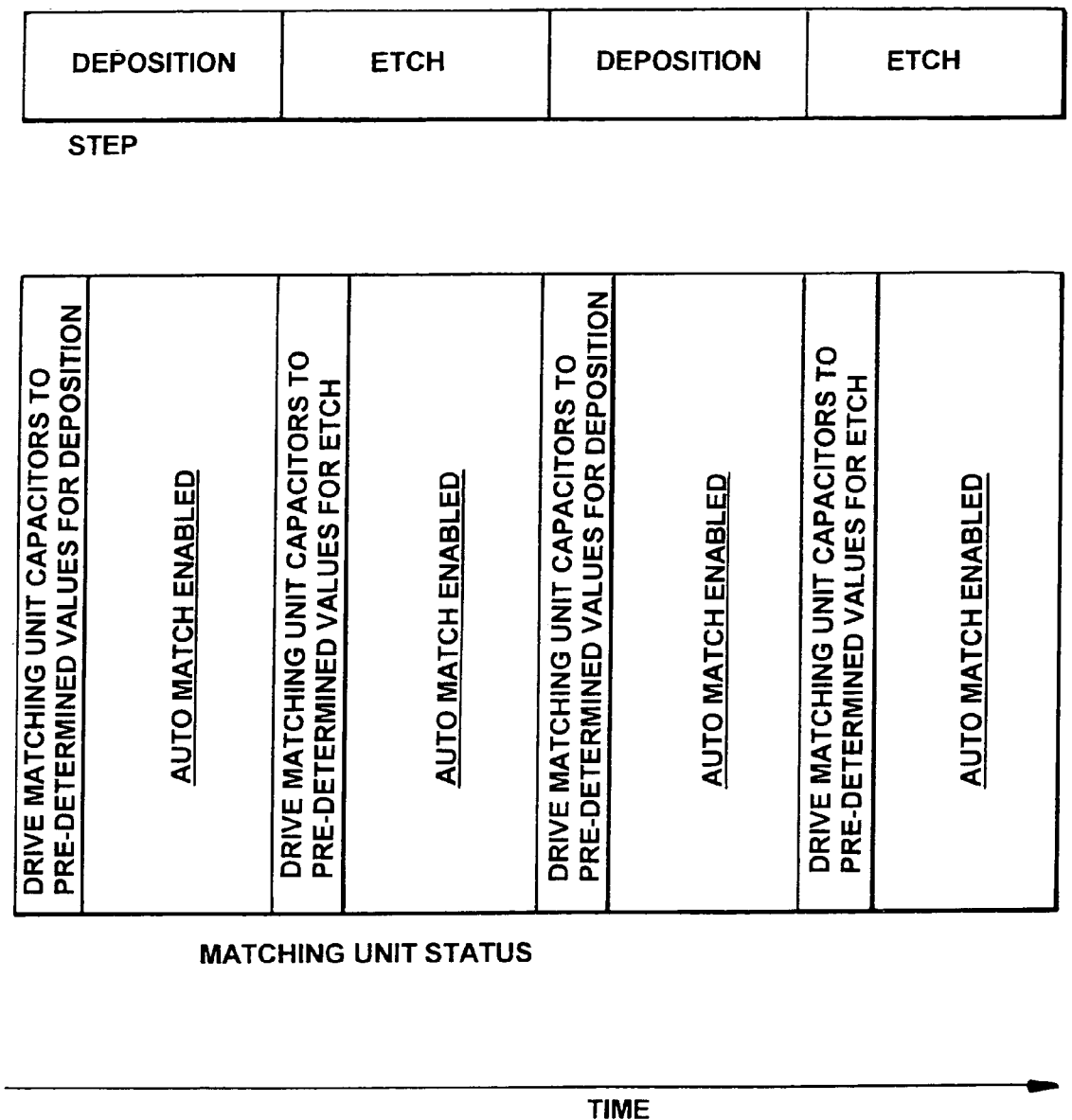
FIG. 2 shows how the sequence of operations according to the invention may be carried out.

In detail, for a two step process involving a deposition step followed by an etch step followed by a further deposition step, a further etch step and then many repetitions of the sequence, it is assumed that the plasma has been struck initially and the description is of an arbitrary stage in the sequence. As the switch occurs to the deposition step, the matching unit settings are driven to pre-determined values that will be close to those required for stable plasma operation in the deposition step. After a period of time, related to the time that the chamber pressure, or other relevant parameter, takes to stabilize, the auto-matching facility is enabled to allow tracking of the plasma impedance. As the end of the deposition step is reached, the auto-matching is disabled and the matching unit settings are set to those required for the etch step. Again, after a pre-set period of time, based on the time that the chamber pressure, or other parameter, takes to stabilize, the auto-matching is re-enabled. The etch plasma impedance is then tracked by the auto-matching facility until the end of the etch step when the auto-matching is again disabled, and the matching unit settings are driven to the values required for the deposition step. The sequence of operations is shown in FIG. 2.

The technique of enabling the auto-match facility during the bulk of the etch and deposition steps, but disabling the facility during the period of switching from one step to the next, permits greater proportions of each step to be more effectively used for the respective process and helps to ensure a smoother transition between the steps. The technique may be used on its own or in conjunction with other techniques such as the injection of a buffer gas, to reduce the pressure transient, during the period of switching from one step to the next.

It has been stated that the auto-matching may be disabled at the end of each step. However, in one embodiment, it may be advantageous to disable it slightly before the end of a step, in order to allow sufficient time for matching unit settings to be pre-set to those required for the next step, particularly if these are significantly different from those in use for the current step.

Figure 6:
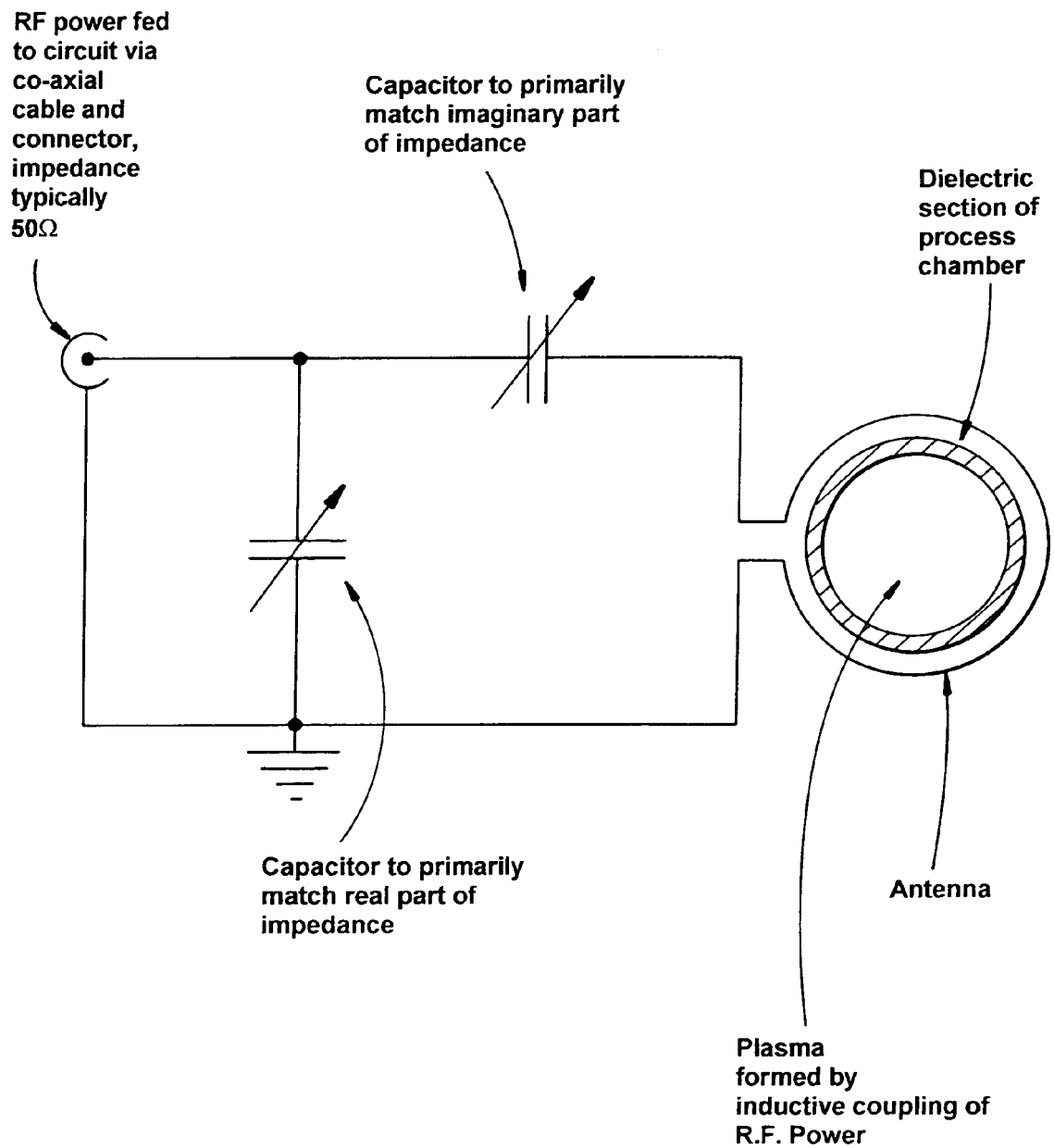
FIG. 6 shows a typical configuration of a matching unit circuit diagram.

By matching unit settings, the reference is in general to the setting positions of variable capacitors in the match unit, which are used to match the real and imaginary parts of the complex plasma impedance to the power supply impedance, as shown in FIG. 6. Auto-matching allows the match unit to compensate for both components of the complex plasma impedance automatically, utilising detected error signals and a simple control loop. Although there is some interaction between the actions of the capacitors, it may be considered that one or more capacitors is used to match the real part of the impedance and one or more capacitors is used to match the imaginary part of the impedance.

In the embodiments of the invention described, when relating to the enabling and disabling of the auto-matching at different times during a switched process, the enabling and disabling may apply to the action on either or both components of the complex impedance. Therefore, it may be considered appropriate during a particular switched process to allow the capacitor(s) relating to, for example, the real part of the impedance to remain under auto-match control throughout, whilst enabling and disabling the auto-match on the capacitor(s) relating to the imaginary part of the impedance.

The settings of the matching unit capacitors, when not in auto-match mode, may be learnt from the previous step of the same type. For example, in a cyclic etch/deposition process, the settings used when starting an etch step may be those recorded towards the end of the auto match period during the previous etch step. This enables an additional adaptive element to be incorporated into the system.

Figure 3:
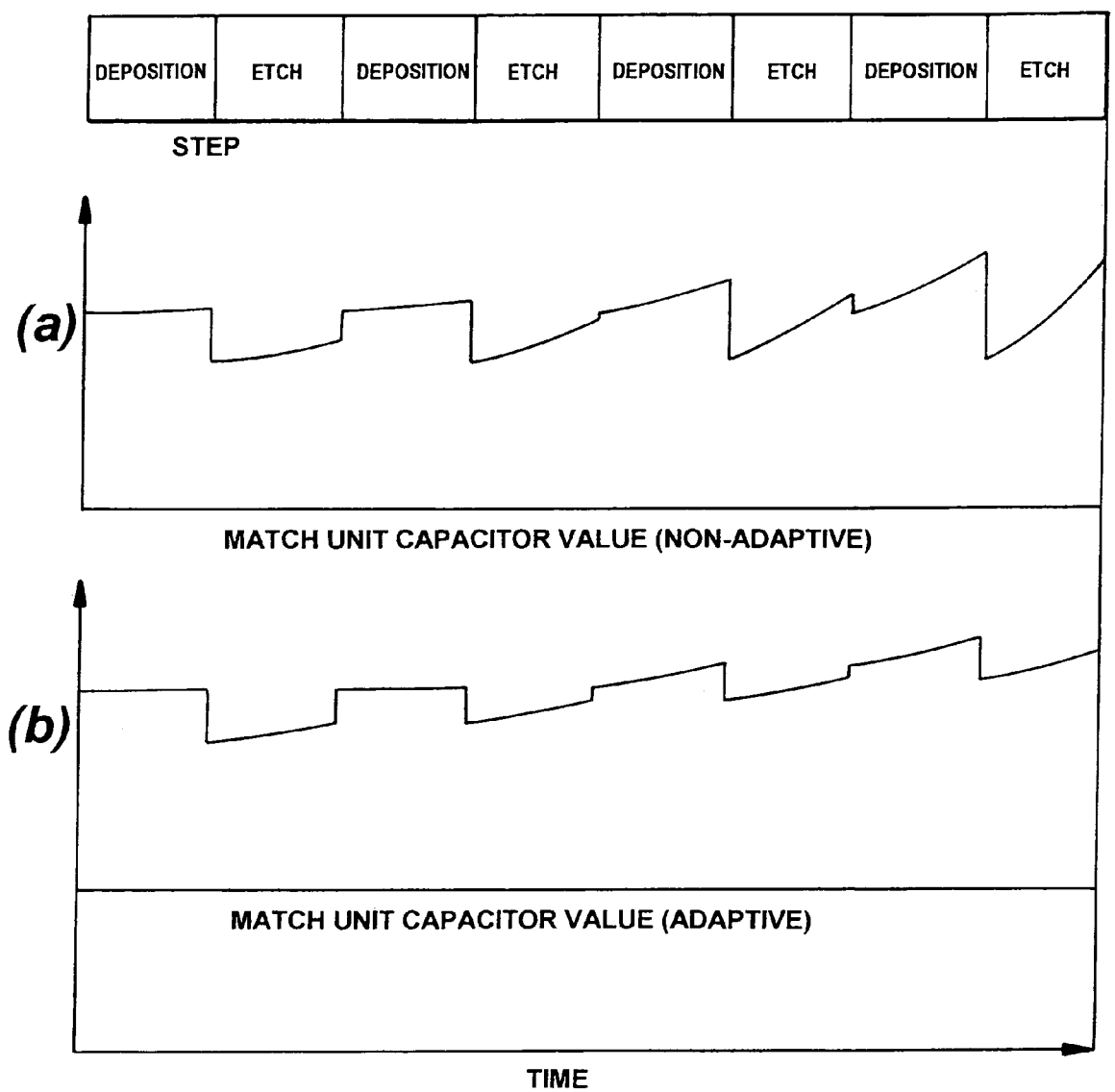
FIGS. 3(a) and (b) show how the value of a capacitor in a matching unit may vary during a switched process.

FIG. 3 shows how the value of a capacitor in the matching unit may vary during a switched process, with (a) non-adaptive and (b) adaptive initial setting, as described above. In FIG. 3(*a*) the capacitor is set to a fixed value in the initial stage of each deposition step. It is also set to a second fixed value in the initial stage of each etch step. During the remainder of each step, the matching unit is switched to auto-match and the capacitor is driven appropriately. In FIG. 3(*b*), during the initial stage of each deposition step, the capacitor is set to the value recorded near the end of the previous deposition step. Also during the initial stage of each etch step, the capacitor is set to the value recorded near the end of the previous etch step. During the remainder of each step, the matching unit is switched to auto match and the capacitor is driven appropriately.

To prevent the plasma from extinguishing during the transition phase, it is necessary to deliver sufficient power to the plasma. This is only possible if the matching unit can track the change in plasma impedance fast enough so as to keep the impedance seen by the RF supply within the range into which the RF generator is designed to operate into. If the impedance goes outside this range, then the generator cannot supply the required power and hence the plasma may be extinguished. The response of the matching unit can be speeded up by simply increasing the gain of the amplifiers that power the motors that drive the capacitors. However, this has the drawback that the matching unit tends to overshoot the desired impedance as the motors are driven in "open loop" by signals that give an indication of the level of mismatch of the real and imaginary parts of the required impedance.

To minimise or eliminate overshoot, feed forward compensation can be applied to the motor drive signals. This compensation method provides a predictive element which can then be used to modify the drive signals such that impedance changes can be tracked rapidly without overshooting. The technique can be implemented in an analogue form by using active devices such as operational amplifiers in conjunction with resistors and capacitors to form the required compensation network. An alternative implementation involving more complicated and sophisticated methods can be applied by using a micro-controller with a stored algorithm. This monitors the various parameters that affect plasma impedance such as pressure, power and gas flow, and then uses this information to predict and modify the drive outputs with weighted coefficients set by switches or downloaded from a PC.

Although it increases the complexity of the system, it is possible that the values to which the matching unit capacitors are set for succeeding steps of the same type, for example etch steps, may be ramped in value during the overall process to provide the best settings which allow for ramping of other process parameters such as chamber pressure or power supplied to the plasma.

2) Provision of a Buffer Gas

If the pressure within the process chamber is prevented from varying by a significant amount during a switched process, then the plasma impedance variation generally will be reduced.

During the transition from an etch step to a deposition step, or vice versa, the mass flow controller delivering one process gas is switched off and the mass flow controller delivering the other process gas is activated. By judicious choice of the timing of the switch-off and switch-on signals, to allow for the delays involved in the valves closing and opening respectively, it is possible to reduce the pressure transient at the transition. This normally involves switching on the second process gas slightly before the first process gas is switched off (because a mass flow controller requires a finite time to shift from fully closed to flow control), thereby allowing the etch and passivation gases to mix during this overlap stage.

Figure 7:
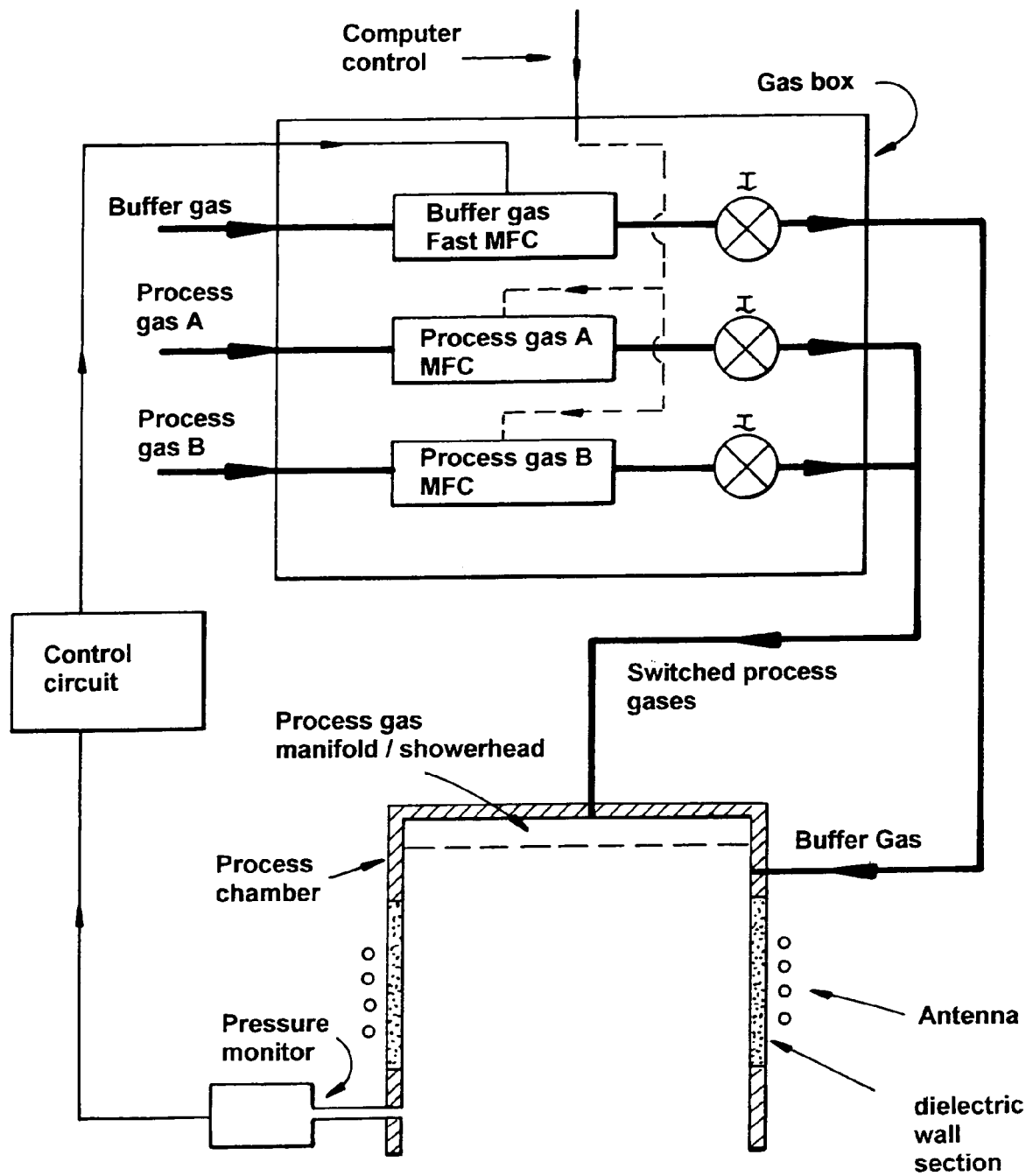
FIG. 7 shows a schematic diagram of a typical configuration of a gas supply system.

Although adjustment of the timings for the on and off operations of the respective mass flow controllers will help to reduce pressure transients in the process chamber, it is likely that there will still be some pressure fluctuation which will affect the plasma impedance and potentially lead to plasma instability. Gas fragmentation by the plasma leads to a pressure increase. This effect becomes more pronounced as the power fed into the plasma is increased. As industry requires ever higher process rates and these are related to the power fed into the plasma, gas fragmentation on application of power (and therefore pressure increase) will become more significant. The degree of gas fragmentation will vary with the process gas used. Therefore, in a high power switched process, there may be a significant pressure variation due to this factor alone. The invention described may provide a means for reducing the pressure transient in the form of the feeding of a buffer gas into the process chamber, controlled by a fast acting flow controller or other means, so that the chamber pressure is maintained close to a constant value, as shown in FIG. 7. In this embodiment, the control loop comprises a pressure monitor on the process chamber feeding control circuitry, which then adjusts the flow of the buffer gas to provide a close to constant total pressure in the process chamber. Clearly, to be effective the flow controller should be fast acting and may need to feed directly into the process chamber as opposed to through process gas manifolding. To minimise response time, the flow controller in general allows some flow of buffer gas all the time, with flow-increased on demand. The buffer gas may be helium, but other gases may also be used.

Figure 4:
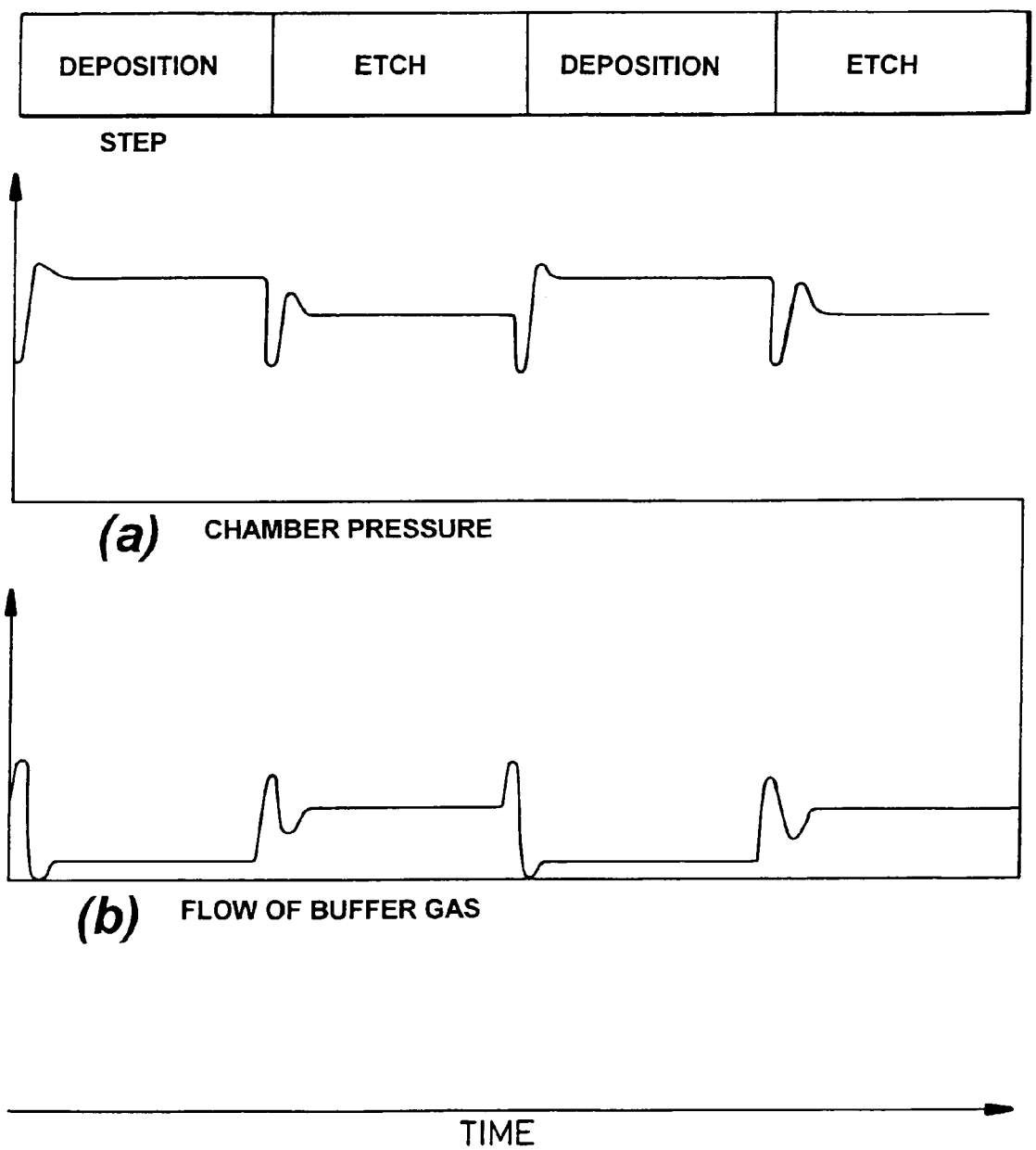
FIGS. 4(a) and (b) show graphically how the flow of buffer gas may be adjusted in response to chamber pressure.

It may be found desirable to allow a significant flow of buffer gas throughout one or more steps of a two or more step switched process, in which the pressure requirements for the respective process gases differ, in order to keep the total pressure in the process chamber near to constant. FIG. 4(b) shows how the flow of buffer gas might be adjusted if the chamber-pressure varied as in FIG. 4(a) without the addition of any buffer gas. Ramping up or down of total pressure during a particular step may be used to allow a smooth transition to the next step, thereby producing a slow change in plasma impedance which can easily be handled by an RF matching unit. This is in addition to smoothing out pressure transients, and resulting plasma impedance changes, at the time of switching from one step to the next.

The incorporation of the additional control system for injecting the buffer gas into the process chamber, must be compatible with the existing control system. Potential conflicts exist, for example, in the use of an existing automatic pressure control system that adjusts the chamber pressure by restricting the flow of gas exhausting from the chamber, and such conflicts may be addressed easily.

As a further means of reducing pressure excursions in the process chamber, a secondary portion of the process chamber, or a side chamber attached to it, may be separated from the primary process chamber by a flexible membrane structure. The primary part of the process chamber contains the wafer, support means and means for generating the plasma. For pressures initially equal, or almost so, on either side of the structure, a pressure increase or decrease in the primary part of the process chamber will result in a deflection of the membrane, the deflection being such as to increase the volume of the primary chamber if the pressure in the primary chamber has increased, or decrease the volume if the pressure in the primary chamber has decreased. This increase or decrease in the volume of the primary portion of the process chamber results in a reduction in the pressure excursion experienced in this chamber.

To be most effective in minimising pressure excursions, the volume of the secondary part of the process chamber, or the side chamber, must be large in comparison with the volume of the primary part of the process chamber. This makes this technique less practicable for systems in which the volume of the primary portion of the process chamber is large, but potentially applicable to smaller process chambers.

The invention claimed is:

1. A method of processing a workpiece in a chamber, the chamber forming part of a processing apparatus, the method comprising:
   (a) using a power supply to form a plasma in the chamber;
   (b) treating the workpiece by cyclically and alternately adjusting the processing parameters between at least a first etching step having a first set of processing parameters of the processing apparatus and a second deposition step having a second set of processing parameters of the processing apparatus; and
   (c) compensating for an impedance mismatch between the impedance of the power supply and the impedance of the plasma by adjusting at least one of the processing parameters of the processing apparatus so as to stabilize the plasma during at least one of (1) the transitions from the first etching to second deposition steps and (2) the transitions from the second deposition to first etching steps.

2. A method according to claim 1, wherein the plasma is stabilized between each cyclic step.

3. A method according to claim 1, wherein the power supply supplies RF power that is inductively coupled to the plasma.

4. A method according to claim 1, wherein the plasma is inductively formed by use of a coil which is driven by the power supply, and wherein the impedance of the plasma is matched with the impedance of the power supply using a matching unit operatively connected between the power supply and the coil.

5. A method according to claim 4, wherein the matching unit is adjustable manually or electrically.

6. A method according to claim 4, wherein the plasma impedance is matched to the power supply impedance automatically for at least a part of the time of treatment of the workpiece.

7. A method according to claim 4, wherein the matching unit is pre-set to act in time at or just before the transition between the first etching and second deposition steps.

8. A method according to claim 7, wherein automatic matching is enabled when the chamber pressure and/or other parameters have stabilized.

9. A method according to claim 6, wherein the automatic matching is disabled at or slightly before the transition.

10. A method according to claim 4, wherein the matching unit is driven by a motor.

11. A method according to claim 10, wherein control signals are used to drive the motor and are modified to track impedance changes rapidly.

12. A method according to claim 4, wherein the matching unit comprises capacitors having set initial values for succeeding steps of the same type which are ramped or otherwise adjusted during the overall process.

13. A method according to claim 12, wherein the initial values for a step of one type are obtained from the values found from automatic matching at the end of the previous step of the same type.

14. A method according to claim 12, wherein the capacitors in the matching unit are adjusted to different values for each of the steps, and/or the frequency of the power supply is altered, either by a direct command or by an automatic control circuit.

15. A method according to claim 14, wherein frequency adjustment of the power supply or pre-setting of the frequency for each of the steps to achieve matching of power into a plasma is utilised to reduce or eliminate the need to adjust matching unit capacitor values.

16. A method according to claim 14, including fixed matching unit capacitor positions, which do not vary between etch and deposition steps, and either a pre-set or automatically adjusted frequency of the RF from the power supply.

17. A method according to claim 14, including fixing of the matching unit capacitor positions to different appropriate settings for etch and deposition steps, and then either presetting or automatically adjusting the frequency of the RF from the power supply.

18. A method according to claim 1, wherein said compensating for the impedance mismatch includes controlling the pressure in the chamber to inhibit variations in the impedance of the plasma between the first and second steps.

19. A method according to claim 18, wherein, during a cyclic etch/deposition process, the deposition gas is supplied, or increased in flow rate, before the etch gas is switched off, or reduced in flow rate, and the etch gas is supplied, or increased in flow rate, before the deposition gas is switched off, or reduced in flow rate.

20. A method according to claim 19, wherein either of the etch or deposition gases are allowed to flow throughout the switched process or for a significant proportion of it.

21. A method according to claim 20, wherein the deposition gas continues to flow throughout the etch step in addition to the deposition step, but normally at a much reduced rate, while the etch gas is only permitted to flow during the etch step.

22. A method according to claim 20, wherein the etch gas continues to flow throughout the deposition step in addition to the etch step, but normally at a much reduced rate, while the deposition gas is only permitted to flow during the deposition step.

23. A method according to claim 20, wherein both etch and deposition gases are allowed to flow simultaneously and continuously.

24. A method according to claim 19, wherein the respective flow rates of the gases generally vary for each of the steps.

25. A method according to claim 1, wherein stabilization of the plasma is enhanced by feeding a further gas into the chamber.

26. A method according to claim 25, wherein the further gas is fed into the chamber by means of a fast acting flow controller.

27. A method according to claim 25, wherein the further gas is selected from helium, argon or other noble gas, oxygen or nitrogen or a mixture thereof.

28. A method according to claim 25, further comprising monitoring the pressure in the chamber and adjusting the flow of the further gas accordingly.

29. A method according to claim 1, wherein the total pressure in the chamber is ramped during a particular step.

30. A method of processing a workpiece in a chamber, the method comprising:
    (a) striking a plasma in the chamber;
    (b) treating the workpiece by cyclically adjusting the processing parameters between at least a first step having a first set of processing parameters and a second step having a second set of process parameters; and
    (c) stabilizing the plasma during the transition between the first and second steps,
    wherein stabilization of the plasma is enhanced by substantially preventing or reducing variation of the pressure in the chamber between the first and second steps, and
    wherein the chamber is provided with a portion separated from the main part of the chamber by a deflectable member.

31. A method according to claim 30, wherein the separated portion is of a volume which is large compared to the main part of the chamber.

32. A plasma processing apparatus comprising a chamber having a support for a workpiece, power supply means for forming a plasma in the chamber, means for cyclically and alternately adjusting processing parameters between a first etch step and a second deposition step, and means for compensating for an impedance mismatch between an impedance of the power supply means and an impedance of the plasma by adjusting at least one processing parameter of the plasma processing apparatus so as to stabilize the plasma during at least one of (1) the transitions from the first etching to second deposition steps and (2) the transitions from the second deposition to first etching steps.

33. A plasma processing apparatus according to claim 32, wherein the compensating means comprising a matching unit for matching the impedance of the plasma to the impedance of the power supply means.

34. A plasma processing apparatus according to claim 32, wherein power supply means comprises an RF power supply which generates an RF power signal, and wherein the compensating means comprises means to vary the frequency of the RF power signal.

35. A plasma processing apparatus according to claim 32, wherein the compensating means inhibits a variation of the pressure in the chamber during at least one of (1) the transitions from the first etching to second deposition steps and (2) the transitions from the second deposition to first etching steps.

* * * * *